(12) United States Patent
Han et al.

(10) Patent No.: US 11,164,933 B2
(45) Date of Patent: Nov. 2, 2021

(54) ELECTROLUMINESCENT DISPLAY DEVICE

(71) Applicant: LG DISPLAY CO., LTD., Seoul (KR)

(72) Inventors: Jeonphill Han, Paju-si (KR); Ji-Heun Lee, Paju-si (KR); TaeYong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/223,854

(22) Filed: Dec. 18, 2018

(65) Prior Publication Data
US 2019/0206979 A1    Jul. 4, 2019

(30) Foreign Application Priority Data
Dec. 29, 2017 (KR) .......... 10-2017-0184839

(51) Int. Cl.
*H01L 27/32*  (2006.01)
*H01L 51/52*  (2006.01)
*H01L 27/12*  (2006.01)

(52) U.S. Cl.
CPC .......... *H01L 27/3279* (2013.01); *H01L 27/12* (2013.01); *H01L 27/3223* (2013.01); *H01L 51/5228* (2013.01); *H01L 51/5271* (2013.01); *H01L 27/3272* (2013.01)

(58) Field of Classification Search
CPC ............. H01L 27/3265; H01L 27/3248; H01L 27/3246; H01L 51/56; H01L 27/3276–27/3279; H01L 27/3211; H01L 27/3218; H01L 51/5221–51/5234; G02F 1/136209; G02F 1/136204; G02F 1/136286; G02F 2001/13629; G09G 3/3225; G09G 3/3233; G09G 3/3258
See application file for complete search history.

(56) References Cited

U.S. PATENT DOCUMENTS

| | | | | |
|---|---|---|---|---|
| 7,619,244 B2 * | 11/2009 | Murakami | .......... | H01L 51/5234 257/40 |
| 7,679,283 B2 * | 3/2010 | Nimura | ............... | H01L 27/3267 313/506 |
| 7,804,242 B2 * | 9/2010 | Kim | .................... | H01L 27/3244 313/506 |
| 8,912,983 B2 * | 12/2014 | Kim | .................... | H01L 27/3279 257/72 |
| 9,111,888 B2 * | 8/2015 | Do | ........................ | H01L 27/3246 |
| 9,324,772 B2 * | 4/2016 | Kim | .................... | H01L 51/5228 |
| 9,559,156 B2 * | 1/2017 | Kim | .................... | H01L 27/3279 |
| 9,921,677 B1 * | 3/2018 | Chen | ................... | H01L 29/4908 |
| 10,177,207 B2 * | 1/2019 | Park | ...................... | H01L 27/3246 |
| 10,177,336 B2 * | 1/2019 | Maeda | ................ | H01L 51/5228 |

(Continued)

*Primary Examiner* — Sophia T Nguyen
(74) *Attorney, Agent, or Firm* — Polsinelli PC

(57) ABSTRACT

Disclosed is an electroluminescent display device capable of overcoming a problem related with a resistance of a low level voltage line without any loss of an aperture ratio, wherein the electroluminescent display device may include a substrate, a first electrode provided on the substrate, a bank configured to cover an end of the first electrode and to define an emission area, an emission layer provided on the first electrode in the emission area defined by the bank, a second electrode provided on the emission layer and the bank, a conductive layer provided on the second electrode, and the low level voltage line provided on the substrate and electrically connected with the second electrode or the conductive layer.

20 Claims, 2 Drawing Sheets

(56) References Cited

U.S. PATENT DOCUMENTS

| | | | |
|---|---|---|---|
| 10,770,682 B2* | 9/2020 | Kim | H01L 27/3258 |
| 10,910,587 B2* | 2/2021 | Pyo | H01L 51/5212 |
| 2002/0044230 A1* | 4/2002 | Yamazaki | G02F 1/133553 |
| | | | 349/43 |
| 2002/0084747 A1* | 7/2002 | Fujieda | H01L 51/5271 |
| | | | 313/506 |
| 2002/0158835 A1* | 10/2002 | Kobayashi | H01L 27/3244 |
| | | | 345/100 |
| 2004/0160165 A1* | 8/2004 | Yamauchi | H01L 27/3246 |
| | | | 313/498 |
| 2005/0179374 A1* | 8/2005 | Kwak | H01L 51/5228 |
| | | | 313/506 |
| 2006/0082284 A1* | 4/2006 | Shibusawa | H01L 27/12 |
| | | | 313/500 |
| 2006/0113900 A1* | 6/2006 | Oh | H01L 27/3276 |
| | | | 313/504 |
| 2007/0176863 A1* | 8/2007 | Oh | H01L 27/3253 |
| | | | 345/82 |
| 2007/0194699 A1* | 8/2007 | Lee | H01L 27/3276 |
| | | | 313/505 |
| 2007/0222380 A1* | 9/2007 | Yamazaki | G09G 3/3233 |
| | | | 313/509 |
| 2007/0290956 A1* | 12/2007 | Young | H01L 27/3276 |
| | | | 345/76 |
| 2008/0100209 A1* | 5/2008 | Ito | H01L 51/5212 |
| | | | 313/504 |
| 2008/0150421 A1* | 6/2008 | Takata | H01L 51/5228 |
| | | | 313/504 |
| 2008/0197778 A1* | 8/2008 | Kubota | H01L 51/5228 |
| | | | 315/73 |
| 2009/0009069 A1* | 1/2009 | Takata | H01L 27/3246 |
| | | | 313/504 |
| 2009/0140638 A1* | 6/2009 | Asano | G09G 3/3233 |
| | | | 313/504 |
| 2009/0256168 A1* | 10/2009 | Taneda | H01L 27/3246 |
| | | | 257/98 |
| 2010/0007272 A1* | 1/2010 | Toyoda | H01L 51/5203 |
| | | | 313/504 |
| 2010/0059754 A1* | 3/2010 | Lee | H01L 27/322 |
| | | | 257/59 |
| 2010/0060147 A1* | 3/2010 | Eom | H01L 51/5234 |
| | | | 313/504 |
| 2010/0078627 A1* | 4/2010 | Yoshinaga | H01L 27/3246 |
| | | | 257/40 |
| 2010/0289728 A1* | 11/2010 | Nakatani | H01L 27/3246 |
| | | | 345/76 |
| 2011/0073868 A1* | 3/2011 | Nakagawa | H01L 27/1214 |
| | | | 257/72 |
| 2011/0140113 A1* | 6/2011 | Park | H01L 27/3276 |
| | | | 257/59 |
| 2011/0272675 A1* | 11/2011 | Chung | H01L 27/3246 |
| | | | 257/40 |
| 2012/0153293 A1* | 6/2012 | Koyama | G09G 3/3241 |
| | | | 257/72 |
| 2013/0037835 A1* | 2/2013 | Lee | H01L 27/3279 |
| | | | 257/91 |
| 2013/0044044 A1* | 2/2013 | Ha | H01L 27/3276 |
| | | | 345/55 |
| 2013/0056784 A1* | 3/2013 | Lee | H01L 27/3279 |
| | | | 257/99 |
| 2013/0099218 A1* | 4/2013 | Lee | H01L 51/5203 |
| | | | 257/40 |
| 2013/0169145 A1* | 7/2013 | Adachi | H01L 27/3248 |
| | | | 313/498 |
| 2013/0300968 A1* | 11/2013 | Okajima | G02F 1/136209 |
| | | | 349/43 |
| 2013/0341607 A1* | 12/2013 | Heo | H01L 51/56 |
| | | | 257/40 |
| 2014/0077725 A1* | 3/2014 | Lee | G09G 3/3225 |
| | | | 315/312 |
| 2014/0098319 A1* | 4/2014 | Jeon | G02F 1/133707 |
| | | | 349/46 |
| 2014/0117336 A1* | 5/2014 | Kim | H01L 27/3246 |
| | | | 257/40 |
| 2014/0151652 A1* | 6/2014 | Im | H01L 27/3279 |
| | | | 257/40 |
| 2014/0183479 A1* | 7/2014 | Park | H01L 51/56 |
| | | | 257/40 |
| 2014/0183501 A1* | 7/2014 | Kim | H01L 51/56 |
| | | | 257/40 |
| 2014/0312323 A1* | 10/2014 | Park | H01L 51/525 |
| | | | 257/40 |
| 2014/0312337 A1* | 10/2014 | Isobe | H01L 51/5231 |
| | | | 257/40 |
| 2014/0346459 A1* | 11/2014 | Song | H01L 51/5228 |
| | | | 257/40 |
| 2014/0353606 A1* | 12/2014 | Choi | H01L 51/5228 |
| | | | 257/40 |
| 2015/0097171 A1* | 4/2015 | Kim | H01L 27/326 |
| | | | 257/40 |
| 2015/0115257 A1* | 4/2015 | Lee | H01L 27/1225 |
| | | | 257/43 |
| 2015/0144922 A1* | 5/2015 | Moon | H01L 27/3279 |
| | | | 257/40 |
| 2015/0236297 A1* | 8/2015 | Hong | H01L 51/5246 |
| | | | 257/40 |
| 2015/0243704 A1* | 8/2015 | Lee | H01L 51/5271 |
| | | | 257/79 |
| 2015/0263079 A1* | 9/2015 | Ko | H01L 27/3265 |
| | | | 257/40 |
| 2015/0270327 A1* | 9/2015 | Oh | H01L 51/5209 |
| | | | 257/40 |
| 2015/0277172 A1* | 10/2015 | Sekine | G02F 1/13306 |
| | | | 349/43 |
| 2015/0379923 A1* | 12/2015 | Lee | G09G 3/3233 |
| | | | 345/206 |
| 2016/0064421 A1* | 3/2016 | Oh | H01L 27/1222 |
| | | | 257/43 |
| 2016/0079286 A1* | 3/2016 | Jin | H01L 29/66742 |
| | | | 257/71 |
| 2016/0079334 A1* | 3/2016 | Lee | H01L 27/3276 |
| | | | 257/40 |
| 2016/0093680 A1* | 3/2016 | Paek | H01L 51/5203 |
| | | | 257/40 |
| 2016/0095172 A1* | 3/2016 | Lee | C23C 16/401 |
| | | | 313/504 |
| 2016/0104759 A1* | 4/2016 | Oshima | H01L 27/3276 |
| | | | 257/40 |
| 2016/0141545 A1* | 5/2016 | Kim | G09G 3/3225 |
| | | | 257/40 |
| 2016/0190225 A1* | 6/2016 | Kim | H01L 27/3276 |
| | | | 257/40 |
| 2016/0284784 A1* | 9/2016 | Lee | H01L 27/3276 |
| 2016/0293888 A1* | 10/2016 | Shim | H01L 27/3246 |
| 2016/0327842 A1* | 11/2016 | Qiao | G02F 1/1362 |
| 2016/0351636 A1* | 12/2016 | Lee | H01L 27/3276 |
| 2016/0351638 A1* | 12/2016 | Im | H01L 27/3246 |
| 2016/0380038 A1* | 12/2016 | Kang | H01L 27/3246 |
| | | | 257/40 |
| 2017/0005158 A1* | 1/2017 | Yeo | H01L 27/3279 |
| 2017/0062548 A1* | 3/2017 | Han | H01L 51/5228 |
| 2017/0077188 A1* | 3/2017 | Kang | H01L 27/3211 |
| 2017/0125507 A1* | 5/2017 | Lee | H01L 51/5228 |
| 2017/0125744 A1* | 5/2017 | Kim | H01L 51/0096 |
| 2017/0133620 A1* | 5/2017 | Lee | H01L 51/5212 |
| 2017/0141176 A1* | 5/2017 | Im | H01L 51/5228 |
| 2017/0155078 A1* | 6/2017 | Lee | H01L 51/5228 |
| 2017/0155093 A1* | 6/2017 | Jo | G02B 7/021 |
| 2017/0170246 A1* | 6/2017 | Im | H01L 27/3246 |
| 2017/0186831 A1* | 6/2017 | Nam | H01L 27/3276 |
| 2017/0194402 A1* | 7/2017 | Choi | H01L 27/3211 |
| 2017/0194415 A1* | 7/2017 | Choi | H01L 51/5234 |
| 2017/0279084 A1* | 9/2017 | Sakamoto | H01L 27/3246 |
| 2017/0322471 A1* | 11/2017 | Jeong | G02F 1/134309 |
| 2017/0330513 A1* | 11/2017 | Hong | H01L 27/3276 |
| 2017/0358688 A1* | 12/2017 | Lee | H01L 27/1218 |
| 2018/0006100 A1* | 1/2018 | Na | H01L 27/3276 |
| 2018/0033829 A1* | 2/2018 | Oh | H01L 27/323 |
| 2018/0061858 A1* | 3/2018 | Lee | G02F 1/136286 |

(56) References Cited

U.S. PATENT DOCUMENTS

| | | | |
|---|---|---|---|
| 2018/0061908 A1* | 3/2018 | Shim | H01L 27/326 |
| 2018/0123078 A1* | 5/2018 | Byun | H01L 51/5206 |
| 2018/0151663 A1* | 5/2018 | Kim | H01L 27/1222 |
| 2018/0151828 A1* | 5/2018 | Im | H01L 27/3279 |
| 2018/0151831 A1* | 5/2018 | Lee | H01L 27/3258 |
| 2018/0151842 A1* | 5/2018 | Park | H01L 51/5275 |
| 2018/0166015 A1* | 6/2018 | Beak | H01L 27/3262 |
| 2018/0182836 A1* | 6/2018 | Beak | H01L 27/3265 |
| 2018/0190944 A1* | 7/2018 | Lee | H01L 27/3258 |
| 2018/0210587 A1* | 7/2018 | Zhang | G06F 3/0412 |
| 2018/0217458 A1* | 8/2018 | Xie | G02F 1/1368 |
| 2018/0356664 A1* | 12/2018 | Yang | H01L 27/20 |
| 2018/0366533 A1* | 12/2018 | Lee | H01L 27/3279 |
| 2019/0131375 A1* | 5/2019 | Kim | H01L 51/5281 |
| 2019/0165085 A1* | 5/2019 | Choi | H01L 51/5271 |
| 2019/0198812 A1* | 6/2019 | Lee | H01L 27/3246 |
| 2019/0206979 A1* | 7/2019 | Han | H01L 27/3279 |
| 2019/0207150 A1* | 7/2019 | Kwon | H01L 51/5206 |
| 2019/0326376 A1* | 10/2019 | Huo | H01L 51/56 |

* cited by examiner

ELECTROLUMINESCENT DISPLAY DEVICE

CROSS-REFERENCE TO RELATED APPLICATION

This application claims the benefit of the Korean Patent Application No. 10-2017-0184839 filed on Dec. 29, 2017, which is hereby incorporated by reference in its entirety as if fully set forth herein.

BACKGROUND

Field of the Disclosure

The present disclosure relates to a display device, and more particularly, to an electroluminescent display device. Although the present disclosure is suitable for a wide scope of applications, it is particularly suitable for overcoming a problem related with a resistance of a low level voltage line in the electroluminescent display device without sacrificing an aperture ratio.

Description of the Background

An electroluminescent display device is provided in such way that an emission layer is formed between two electrodes. As the emission layer emits light by an electric field generated between the two electrodes, an image is displayed on the electroluminescent display device.

The emission layer may be formed of an organic material which emits light when the exciton is produced by a bond of electron and hole, and the exciton falls to a ground state from an excited state. Otherwise the emission layer may be formed of an inorganic material such as quantum dot.

Recently, a top emission type is applied to the electroluminescent display device. Most cases of the top emission type of the electroluminescent display device, a cathode electrode is provided with a thin thickness and formed of a transparent metal material. Accordingly, the low level voltage line connected with the cathode electrode is increased in its resistance so that it may cause a problem related with non-uniformity of luminance over all pixels.

SUMMARY

The present disclosure has been made in view of the above problems, and the present disclosure is to provide an electroluminescent display device which is capable of overcoming a problem related with a resistance of the low level voltage line without any loss of an aperture ratio.

In accordance with an aspect of the present disclosure, the above and other objects can be accomplished by the provision of an electroluminescent display device comprising a substrate, a first electrode provided on the substrate, a bank configured to cover an end of the first electrode and to define an emission area, an emission layer provided on the first electrode in the emission area defined by the bank, a second electrode provided on the emission layer and the bank, a conductive layer provided on the second electrode, and the low level voltage line provided on the substrate and electrically connected to the second electrode or the conductive layer.

In another aspect of the present disclosure, an electroluminescent display device includes a substrate where an active area and a non-active area are defined; a first electrode disposed on the substrate; a bank covering both lateral ends of the first electrode and defining an emission area which corresponds to an aperture portion of the active area; a second electrode disposed on the emission layer and the bank; an emission layer disposed between the first and second electrodes in the emission area defined by the bank; a low level voltage line disposed at a low level voltage line contact portion of the non-active area and electrically connected to the second electrode; and a conductive layer disposed on the second electrode and positioned at the bank portion and the low level voltage line contact portion.

In a further aspect of the present disclosure, an electroluminescent display device includes a substrate where an active area and a non-active area are defined, wherein the active area includes an aperture portion and a bank portion, and the non-active area includes a gate driver, a pad portion and a low level voltage line contact portion; a thin film transistor disposed at the aperture portion of the active area; a passivation layer covering the thin film transistor and having first and second contact holes; a first electrode disposed at the aperture portion and electrically connected to the thin film transistor through the first contact hole; a bank covering both lateral ends of the first electrode and defining an emission area which corresponds to the aperture portion of the active area; a second electrode disposed on the emission layer and the bank; an emission layer disposed between the first and second electrodes in the emission area defined by the bank; a low level voltage line disposed at a low level voltage line contact portion of the non-active area and electrically connected to the second electrode through the first contact hole; and a conductive layer disposed on the second electrode and positioned at the bank portion and the low level voltage line contact portion.

It is to be understood that both the foregoing general description and the following detailed description are exemplary and explanatory and are intended to provide further explanation of the disclosure as claimed.

BRIEF DESCRIPTION OF THE DRAWINGS

The above and features and other advantages of the present disclosure will be more clearly understood from the following detailed description taken in conjunction with the accompanying drawings, in which.

DETAILED DESCRIPTION

Figure 1:
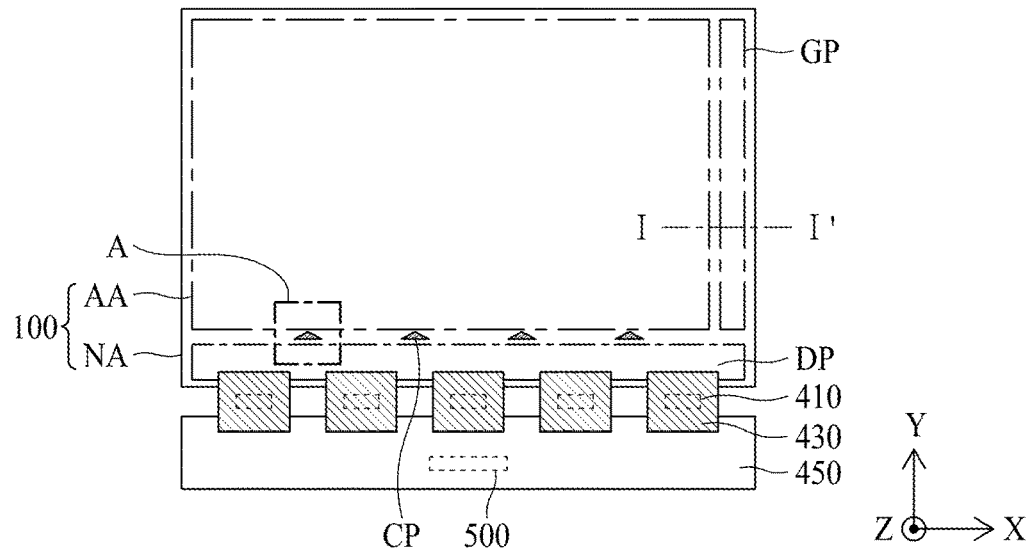
FIG. 1 is a plane view illustrating an electroluminescent display device according to an aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including the margins of error although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, an electroluminescent display device according to an aspect of the present disclosure will be described in detail with reference to the accompanying drawings.

FIG. 1 is a plane view illustrating an electroluminescent display device according to an aspect of the present disclosure. As shown in FIG. 1, the X-axis indicates a direction which is parallel to a gate line, the Y-axis indicates a direction which is parallel to a data line, and the Z-axis indicates a height (or thickness) direction of the electroluminescent display device.

Referring to FIG. 1, the electroluminescent display device according to an aspect of the present disclosure may include a substrate 100, a source drive integrated circuit 410, a flexible film 430, a circuit board 450 and a timing controller 500.

The substrate 100 may be a flexible substrate. For example, the substrate 100 may include a transparent polyimide material. The substrate 100 of the polyimide material may be obtained by curing polyimide resin coated with a uniform thickness onto the front surface of a release layer prepared in a carrier glass substrate. The carrier glass substrate is separated from the substrate 100 by the elimination of the release layer for a laser release process. On one surface of the substrate 100, there are pluralities of gate lines, data lines, and pixels. The pixels may include a plurality of sub pixels, and the plurality of sub pixels are provided adjacent to crossing areas of the gate lines and the data lines.

The substrate 100 according to an aspect of the present disclosure may include an active area AA and a non-active area NA.

The active area AA corresponds to an area for displaying an image thereon, which may be defined in the middle of the substrate 100. The active area AA may be provided with the gate lines, the data lines and the pixels.

The non-active area NA corresponds to an area on which an image is not displayed, wherein the non-active area NA may be defined in the periphery of the substrate 100 so as to surround the active area AA. The non-active area NA may be provided with a gate driver GP, a pad portion DP and a low level voltage line contact portion CP.

The gate driver GP supplies the gate signals to the gate lines in accordance with a gate control signal which is provided from the timing controller 500. The gate driver GP may be provided in the non-active area NA at an outer side of the active area AA of the substrate 100 by a GIP (i.e., gate driver in panel) method.

The pad portion DP supplies the data signals to the data lines in accordance with a data control signal which is provided from the timing controller 500. The pad portion DP may be manufactured in a driving chip, mounted on the flexible film 430, and attached to the non-active area NA at an outer area from the active area AA of the substrate 100 by a TAB (i.e., tape automated bonding) method.

The low level voltage line contact portion CP may connect a low level voltage line and a second electrode included in the pixel of the active area AA. For example, the low level voltage line contact portion CP is provided in an area which overlaps the edge of the second electrode, so that the low level voltage line contact portion CP can be electrically connected to the edge of the second electrode via a contact hole.

The source drive integrated circuit 410 receives the digital video data and the source control signal from the timing controller 500. The source drive integrated circuit 410 converts the digital video data into the analog data voltages in accordance with the source control signal, and provides the analog data voltages to the data lines. If the source drive integrated circuit 410 is manufactured in a driving chip, the source drive integrated circuit 410 may be mounted on the flexible film 430 by a COF (i.e., chip on film) method or a COP (i.e., chip on plastic) method.

The flexible film 430 may be provided with lines for connecting the pad portion DP and the source drive integrated circuit 410 with each other, and lines for connecting the pad portion DP and the circuit board 450 with each other. The flexible film 430 is attached onto the pad portion DP by the use of an anisotropic conducting film, so that the pad portion DP can be connected to the lines of the flexible film 430.

The circuit board 450 may be attached to the flexible films 430. A plurality of circuits, which is implemented as driving chips, may be mounted on the circuit board 450. For example, the timing controller 500 may be mounted on the circuit board 450. The circuit board 450 may be a printed circuit board or a flexible printed circuit board.

The timing controller 500 receives the digital video data and the timing signal from an external system board via a cable of the circuit board 450. The timing controller 500 generates a gate control signal for controlling an operation timing of the gate driver GP, and a source control signal for controlling the source drive integrated circuits 410 on the basis of timing signal. The timing controller 500 supplies the gate control signal to the gate driver GP, and supplies the source control signal to the source drive integrated circuits 410.

Figure 2:
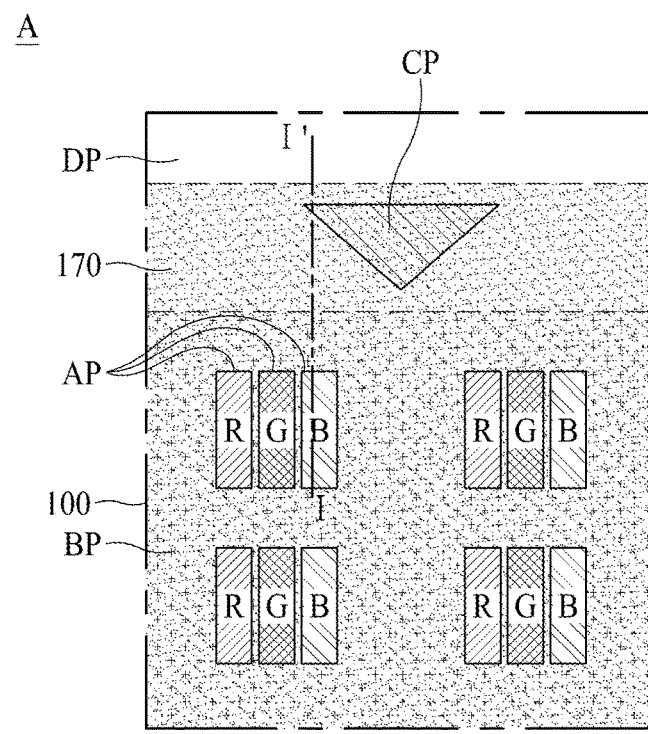
FIG. 2 is an enlarged plane view showing rectangular portion 'A' of FIG. 1.
Figure 3:
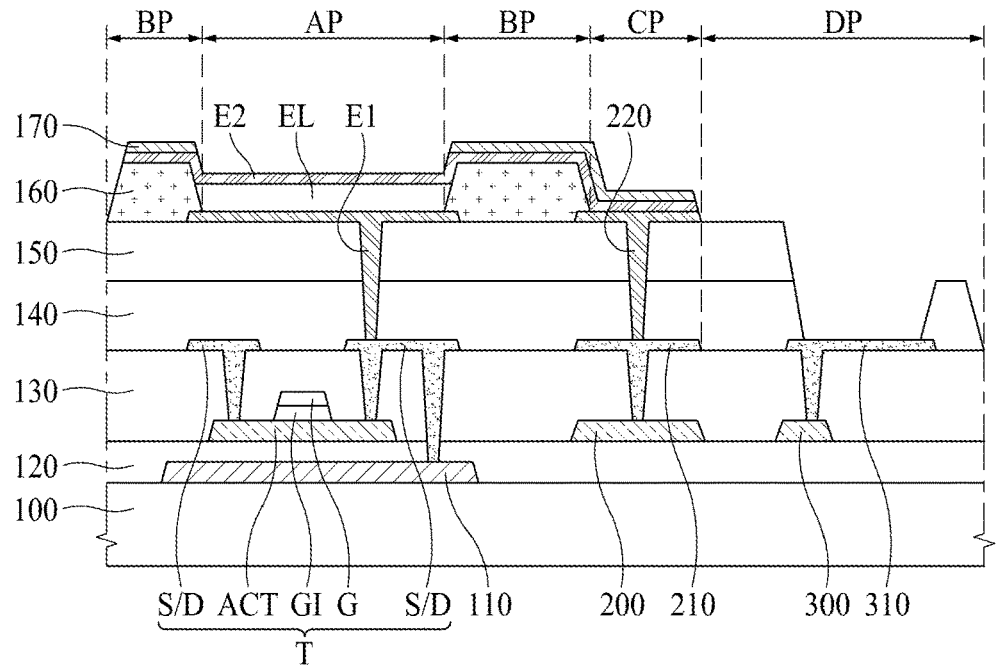
FIG. 3 is a cross sectional view along I-I' of FIG. 2 according to an aspect of the present disclosure.

FIG. 2 is an enlarged plane view showing rectangular portion 'A' of FIG. 1. FIG. 3 is a cross sectional view along I-I' of FIG. 2 according to an aspect of the present disclosure.

Referring to FIGS. 2 and 3, the electroluminescent display device according to an aspect of the present disclosure may include a substrate 100, a light shielding layer 110, a buffer layer 120, a thin film transistor T, an insulating interlayer 130, a passivation layer 140, a planarization layer 150, a first electrode E1, a bank 160, an emission layer EL, a second electrode E2, a conductive layer 170, a low level voltage line (VSS) 200, a signal pad 300 and a pad electrode 310.

The substrate 100 may be a flexible substrate, as described above, but not limited to this type.

As described above, the substrate 100 according to an aspect of the present disclosure may include an active area AA and a non-active area NA, wherein the active area AA may include an aperture portion AP and a bank portion BP, and the non-active area NA may include a gate driver GP, a pad portion DP and a low level voltage line contact portion CP.

The aperture portion AP may be an emission portion which is not provided with a bank, and the bank portion BP may be a non-emission portion which is provided with a bank. As described above, the gate driver GP, the pad portion DP and the low level voltage line contact portion CP correspond to the predetermined portions of the non-active area NA. However, elements for the non-active area NA are not limited to the above portions such as the gate driver GP, the pad portion DP and the low level voltage line contact portion CP, that is, the non-active area NA is not realized by combining only the above portions such as the gate driver GP, the pad portion DP and the low level voltage line contact portion CP.

The light shielding layer 110 is provided on the aperture portion AP of the substrate 100. The light shielding layer 110 prevents light from being advanced to an active layer ACT to be explained later.

The buffer layer 120 is provided on the light shielding layer 110. The buffer layer 120 extends from the active area AA to the non-active area NA. The buffer layer 120 may be formed of an inorganic insulating material, for example, formed in a single-layered structure or a multi-layered structure of a silicon oxide (SiOx) film or a silicon nitride (SiNx) film, but not limited to these structures.

The thin film transistor T is provided at the aperture portion AP of the substrate 100. More specifically, the thin film transistor T is provided on the buffer layer 120. The thin film transistor T may include the aforementioned active layer ACT, a gate electrode G, and source/drain electrodes S/D.

The active layer ACT is provided on the buffer layer 120. A gate insulating film GI is provided on the active layer ACT, and a gate electrode G is provided on the gate insulating film GI. Further, an intermediate insulating interlayer 130 is provided on the gate electrode G, and the source/drain electrodes S/D are provided on the insulating interlayer 130.

The active layer ACT according to an aspect of the present disclosure may be formed of a silicon-based semiconductor material or an oxide-based semiconductor material.

The gate insulating film GI insulates the active layer ACT and the gate electrode G from each other, wherein a pattern of the gate insulating film GI may be identical to a pattern of the gate electrode G. The gate insulating film GI may be formed of an inorganic insulating material, for example, formed in a singular-layered structure or a multi-layered structure of a silicon oxide (SiOx) film or a silicon nitride (SiNx) film, but not limited to these structures.

The gate electrode G is provided on the gate insulating film GI.

The intermediate insulating interlayer 130 may be formed of an inorganic insulating material, for example, formed in a single-layered structure or a multi-layered structure of a silicon oxide (SiOx) film or a silicon nitride (SiNx) film, but not limited to these structures. The intermediate insulating interlayer 130 extends from the active area AA to the non-active area NA.

The source/drain electrodes S/D facing each other are provided on the insulating interlayer 130. Herein, contact holes for exposing one end and the other end of the active layer ACT are provided in the intermediate insulating interlayer 130, and the source/drain electrodes S/D are respectively connected with one end and the other end of the active layer ACT via the contact holes.

In addition, a contact hole for exposing the light shielding layer 110 is provided in the buffer layer 120 and the intermediate insulating interlayer 130, and the source/drain electrodes S/D are connected with the light shielding layer 110 via the contact hole. The light shielding layer 110 according to an aspect of the present disclosure is formed of a conductive material. When the light shielding layer 110 is in the floating state, the active layer ACT may be negatively influenced by the floating light shielding layer 110. In this reason, the light shielding layer 110 is connected with the source/drain electrodes S/D, so that an adverse influence or effect on the active layer ACT can be prevented.

The passivation layer 140 is provided on the source/drain electrodes S/D. The passivation layer 140 protects the thin film transistor T, and the passivation layer 140 extends from the active area AA to the non-active area NA. The passivation layer 140 may be formed of an inorganic insulating material, for example, a silicon oxide (SiOx) film or a silicon nitride (SiNx) film, but not limited to these materials.

The planarization layer 150 is provided on the passivation layer 140. The planarization layer 150 may planarize an upper surface of the substrate 100 including the thin film transistor T. The planarization layer 150 may be formed of an organic insulating material, for example, acryl resin, epoxy resin, phenolic resin, polyamide resin, polyimide resin, and etc., but not limited to these materials.

The first electrode E1 is provided within the aperture portion AP of the substrate 100. The first electrode E1 is provided on the planarization layer 150.

The first electrode E1 according to an aspect of the present disclosure may be connected to the source electrode S or the drain electrodes D via the contact hole provided in the passivation layer 140 and the planarization layer 150.

The first electrode E1 according to an aspect of the present disclosure is patterned as corresponding to each pixel, and the first electrode E1 according to an aspect of the present disclosure may serve as an anode of the electroluminescent display device. When the electroluminescent display device according to an aspect of the present disclosure is applied to a top emission type, the first electrode E1 may include a reflective material for upwardly reflecting light emitted from the emission layer EL. In this case, the first electrode E1 may be formed in a stacked structure including the reflective material and a transparent conductive material.

The bank 160 is provided on the bank portion BP of the substrate 100. The bank 160 covers an end of the first electrode E1 and defines an emission area. An upper surface of the first electrode E1 is exposed in the emission area between each of the banks 160 according to an aspect of the present disclosure, and light is emitted through the exposed upper surface of the first electrode E1, to thereby display an image.

The bank 160 according to an aspect of the present disclosure may be formed of an organic insulating material, for example, polyimide resin, acryl resin, benzocyclobutene (BCB), and etc., but not limited to these materials.

The emission layer EL is provided on the aperture portion AP of the substrate 100. The emission layer EL is provided on the first electrode E1 in the emission area defined by the bank 160. The emission layer EL according to an aspect of the present disclosure may include a hole injecting layer, a hole transporting layer, an organic emitting layer, an electron transporting layer, and an electron injecting layer. The structure of the emission layer EL may be changed in various types generally known to those in the art.

The emission layer EL according to an aspect of the present disclosure may include a red emitting material layer, a green emitting material layer and a blue emitting material layer. Accordingly, the aperture portion AP may include a red sub pixel, a green sub pixel and a blue sub pixel, wherein the above red, green and blue sub pixels constitute one unit pixel.

The second electrode E2 is provided on the emission layer EL and the bank 160. In the case of the top emission type, as the second electrode E2 is provided on a light emission surface, the second electrode E2 may be formed of a transparent conductive material. However, as the transparent conductive material has a high resistance, the conductive layer 170 may be additionally provided so as to reduce the resistance of the second electrode E2.

The second electrode E2 according to an aspect of the present disclosure may be provided on the active area AA and the low level voltage line contact portion CP of the substrate 100. In detail, the second electrode E2 may be provided to cover the active area AA and the low level voltage line contact portion CP of the substrate 100 as one body. Accordingly, the second electrode E2 is provided as one body without being patterned by each pixel, and the second electrode E2 is thinly formed of a transparent conductive material, for example, metal material such as MgAg, whereby the low level voltage line 200 electrically connected with the second electrode E2 may have a high resistance, and it may cause non-uniformity of luminance over all of the pixels. Thus, the electroluminescent display device according to the first aspect of the present disclosure may include the conductive layer 170, additionally.

The conductive layer 170 is provided on the second electrode E2. The conductive layer 170 is in contact with the second electrode E2 so that it is possible to reduce the resistance of the second electrode E2. The conductive layer 170 is provided on the bank portion BP and the low level voltage line contact portion CP of the substrate 100.

The conductive layer 170 according to an aspect of the present disclosure may be formed of a metal material having high conductivity, for example, aluminum (Al). The conductive layer 170 is formed in a pattern shape on the bank portion BP and the low level voltage line contact portion CP so that deterioration in transmittance of the aperture portion AP can be prevented. As the conductive layer 170 is formed of the material having high conductivity, the resistance of the second electrode E2 through the surface contact between the conductive layer 170 and the second electrode (E2) can be reduced.

The conductive layer 170 according to an aspect of the present disclosure may be formed of a reflective material. In this case, light emitted from the emission layer EL may be reflected on the conductive layer 170, so that a light emission efficiency can be improved.

Meanwhile, although not shown in figures, an encapsulation layer may be additionally provided on the conductive layer 170 so as to prevent external moisture or oxygen from being permeated into the emission layer EL. The encapsulation layer may be formed of an inorganic insulating material, or may be formed in a stacked structure obtained by alternately depositing an inorganic insulating material and an organic insulating material, but not limited to these structures.

The low level voltage line 200 is provided on the low level voltage line contact portion CP of the substrate 100. The low level voltage line 200 is provided on the buffer layer 120. The low level voltage line 200 according to an aspect of the present disclosure may apply a low level voltage to the second electrode E2. For example, the low level voltage line 200 may be electrically connected with the second electrode E2 via connection electrodes 210 and 220.

Also, a contact hole for exposing the low level voltage line 200 is provided in the buffer layer 120 and the intermediate insulating interlayer 130 according to an aspect of the present disclosure, and the second electrode E2 may be connected with the low level voltage line 200 via the connection electrodes 210 and 220 provided in the contact hole. The connection electrodes 210 and 220 may include the first connection electrode 210 being in contact with the low level voltage line 200, and the second connection electrode 220 being in contact with the second electrode E2.

The first connection electrode 210 is provided on the same layer as the source/drain electrodes S/D is disposed, and is formed of the same material as that of the source/drain electrodes S/D. In this case, the source/drain electrodes S/D and the first connection electrode 210 may be manufactured at the same time by the same process, to thereby improve a manufacturing efficiency.

The second connection electrode 220 is provided on the same layer as the first electrode E1 is disposed, and is formed of the same material as that of the first electrode E1. In this case, the first electrode E1 and the second connection electrode 220 may be manufactured at the same time by the same process, to thereby improve a manufacturing efficiency.

The low level voltage line 200 according to an aspect of the present disclosure is electrically connected with the second electrode E2, and the second electrode E2 is electrically connected with the conductive layer 170, so that a resistance of the low level voltage line 200 can be reduced. That is, as described above, the conductive layer 170 is formed in a pattern shape of a material having high conductivity, and then in contact with the second electrode E2, so that the resistance of the second electrode E2 can be lowered, and thus, a resistance of the low level voltage line 200 connected with the second electrode E2 can be also lowered. Even though there is an additional auxiliary line in the electroluminescent display device according to an aspect of the present disclosure, the resistance of the low level voltage line 200 can be reduced. Thus, an area of the aperture portion AP may be increased by eliminating an occupied area required for the auxiliary line, so that an aperture ratio can be improved.

In case of the electroluminescent display device according to an aspect of the present disclosure, the resistance of the low level voltage line (VSS) 200 can be maintained in a low state, and also uniformity of luminance can be improved by preventing non-uniformity of luminance over all of the pixels. Also, the auxiliary line is not required in the electroluminescent display device according to an aspect of the present disclosure, so that an aperture ratio can be improved, and also a long lifespan of the electroluminescent display device can be achieved according to an aspect of the present disclosure.

The signal pad 300 is provided on the pad portion DP of the substrate 100. The signal pad 300 is provided on the buffer layer 120. The signal pad 300 according to an aspect of the present disclosure may be formed of the same material as that of the gate electrode G of the active area AA. In this case, the signal pad 300 and the gate electrode G may be manufactured at the same time by the same process.

The pad electrode 310 is provided on the pad portion DP of the substrate 100. The pad electrode 310 is provided on the insulating interlayer 130, and is connected with the signal pad 300 via the contact hole.

The pad electrode 310 according to an aspect of the present disclosure may be formed of the same material as those of the first connection electrode 210 and the source/drain electrodes S/D of the active area AA. In this case, the pad electrode 310, the source/drain electrodes S/D and the first connection electrode 210 may be manufactured at the same time by the same process.

Additionally, a corrosion-resistant cover pad electrode may be provided on an upper surface of the pad electrode 310 according to an aspect of the present disclosure. Thus, a lateral surface of the pad electrode 310 is covered by the passivation layer 140, so that the lateral surface of the pad electrode 310 can be prevented from being corroded, and the upper surface of the pad electrode 310 can be prevented from being corroded by the use of corrosion-resistant cover pad electrode.

Figure 4:
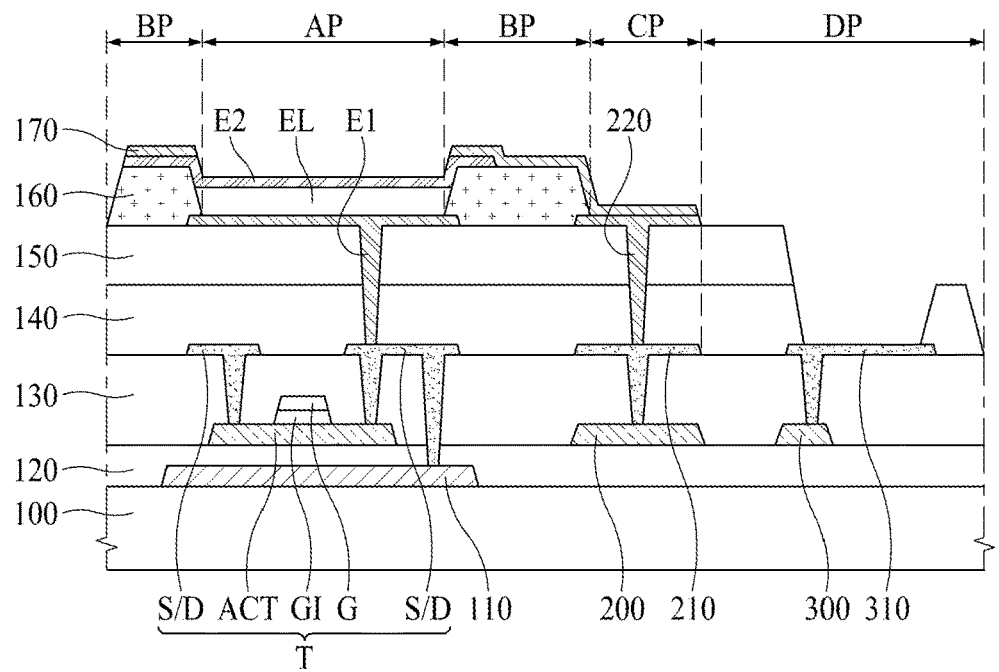
FIG. 4 is a cross sectional view along I-I' of FIG. 2 according to another aspect of the present disclosure.

FIG. 4 is a cross-sectional view along I-I' of FIG. 2 according to another aspect of the present disclosure. The electroluminescent display device of FIG. 4 can be implemented by changing a structure of a second electrode E2, and a detailed description for the same parts will be omitted, and only the different structures will be described in detail as follows.

Referring to FIG. 4 the electroluminescent display device according to another aspect of the present disclosure includes the second electrode E2.

The second electrode E2 is provided on an emission layer EL and a bank 160. As the second electrode E2 is provided on a light emission surface, the second electrode E2 is formed of a transparent conductive material. However, the transparent conductive material has a relatively higher resistance than a metal material, a conductive layer 170 may be additionally provided to reduce the resistance of the second electrode E2.

The second electrode E2 according to another aspect of the present disclosure may be provided on an aperture portion AP of a substrate 100. In detail, the second electrode E2 may be formed in a pattern shape on the aperture portion AP of the substrate 100. The second electrode E2 is patterned by each pixel, whereby the second electrode E2 is not directly connected with a low level voltage line 200. The second electrode E2 is in contact with the conductive layer 170, and is electrically connected with the conductive layer 170, and the conductive layer 170 is electrically connected with the low level voltage line 200 via a contact hole, whereby the second electrode E2 and the low level voltage line 200 may be electrically connected with each other.

The low level voltage line 200 according to another aspect of the present disclosure is provided on a low level voltage line contact portion CP of the substrate 100. The low level voltage line 200 according to another aspect of the present disclosure may be electrically connected to the conductive layer 170 via connection electrodes 210 and 220.

Also, a contact hole for exposing the low level voltage line 200 is provided in a buffer layer 120 and an intermediate insulating interlayer 130 according to another aspect of the present disclosure, and the conductive layer 170 may be connected with the low level voltage line 200 via the connection electrodes 210 and 220 provided in the contact hole.

The low level voltage line 200 according to another aspect of the present disclosure is electrically connected to the conductive layer 170, and the conductive layer 170 is electrically connected to the second electrode E2, so that a resistance of the low level voltage line 200 can be reduced. That is, when the conductive layer 170 is formed in a pattern shape of a material having high conductivity, and is then electrically connected to the low level voltage line 200, the resistance of the low level voltage line 200 may have relatively lowered resistance as compared to the resistance of the low level voltage line 200 on the direct contact between the low level voltage line 200 and the second electrode E2. That is, according as the conductive layer 170 formed in the plurality of pattern shapes is in contact with the second electrode E2, the resistance in the conductive layer 170 and the second electrode E2 is lowered. Thus, even though an additional auxiliary line is not provided in the electroluminescent display device according to another aspect of the present disclosure, it is possible to reduce the resistance of the low level voltage line 200. Thus, an area of the aperture portion AP may be increased by eliminating an occupied area for the auxiliary line, so that an aperture ratio can be improved.

In case of the electroluminescent display device according to another aspect of the present disclosure, the resistance of the low level voltage line 200 can be maintained in relatively a low state, and uniformity of luminance can be improved by preventing non-uniformity of luminance over all of the pixels. Also, the auxiliary line is not provided in the electroluminescent display device according to another aspect of the present disclosure so that it is possible to improve the aperture ratio, and also to ensure a long lifespan of the electroluminescent display device according to another aspect of the present disclosure.

According to the aspects of the present disclosure, the resistance of the low level voltage line can be reduced by the use of conductive layer formed in the pattern shape on the second electrode, thereby improving an aperture ratio and ensuring a long lifespan of an electroluminescent display device.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The aspects of the present disclosure can be modified, if necessary to employ concepts of the various patents, applications and publications to provide yet further aspects.

These and other changes can be made to the aspects of the present disclosure in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An electroluminescent display device comprising:
    a substrate including an active area and a non-active area surrounding the active area, the active area including a plurality of aperture portions, and the non-active area including a low level voltage line contact portion;
    an active layer disposed in each of the aperture portion;
    a low level voltage line disposed in the low level voltage line contact portion, the active layer and the low level voltage line disposed on a same layer;
    a gate electrode disposed on a gate insulating film covering a middle portion of the active layer;
    an intermediate insulating layer on the gate electrode and the active layer;
    source-drain electrodes disposed on the insulating layer, the source-drain electrodes contact both end portions of the active layer;
    a first connection electrode disposed on the insulating layer and connected with the low level voltage line;
    a passivation layer on the source-drain electrodes and the first connection electrode;
    a planarization layer on the passivation layer;
    a first electrode provided on the planarization layer;
    a second connection electrode on the planarization layer;
    a bank covering an end of the first electrode and defining an emission area, the emission area corresponding to each of the aperture portions;
    an emission layer provided on the first electrode in the emission area defined by the bank;
    a second electrode provided on the emission layer and a first portion of the bank; and
    a conductive layer provided on the second electrode that is disposed on the first portion of the bank and extended onto a second portion of the bank where no second electrode is provided,
    wherein no conductive layer is provided on the emission layer at the plurality of aperture portions, and no bank is provided at the low level voltage line contact portion,
    wherein the conductive layer is in contact with the second electrode that is disposed on the first portion of the bank, and the conductive layer is further in contact with the second connection electrode at the low level voltage line contact portion,
    wherein the source-drain electrodes and the first connection electrode are disposed on a same layer and made of a same material, and
    wherein the first electrode and the second connection electrode are disposed on a same layer and made of a same material.

2. The electroluminescent display device according to claim 1,
    wherein the non-active area further includes a gate driver and a pad portion.

3. The electroluminescent display device according to claim 2,
    wherein the planarization layer and the passivation layer include a contact hole therein.

4. The electroluminescent display device according to claim 3, wherein the second electrode is provided at the active area and the low level voltage line contact portion.

5. The electroluminescent display device according to claim 4, wherein the second electrode is connected with the low level voltage line via the second connection electrode located in the contact hole.

6. The electroluminescent display device according to claim 3, wherein the second electrode is provided at the aperture portion.

7. The electroluminescent display device according to claim 3, wherein the conductive layer is connected with the low level voltage line via the second connection electrode located in the contact hole.

8. The electroluminescent display device according to claim 1, wherein the conductive layer includes a reflective material.

9. An electroluminescent display device comprising:
    a substrate where an active area and a non-active area are defined, the active area corresponding to middle portions of the substrate, and the non-active area corresponding to circumference portions of the substrate;
    an active layer disposed in each of the aperture portion;
    a low level voltage line disposed at a low level voltage line contact portion of the non-active area, the active layer and the low level voltage line disposed on a same layer;
    a gate electrode disposed on a gate insulating film covering a middle portion of the active layer;
    an intermediate insulating layer on the gate electrode and the active layer;
    source-drain electrodes disposed on the insulating layer, the source-drain electrodes contact both end portions of the active layer;
    a first connection electrode disposed on the insulating layer and at the low level voltage line contact portion of the non-active area and electrically connected to the low level voltage line;
    a passivation layer on the source-drain electrodes and the first connection electrode;
    a planarization layer on the passivation layer;
    a first electrode disposed on the planarization layer;

a second connection electrode on the planarization layer and at the low level voltage line contact portion of the non-active area and electrically connected to the first connection electrode;
a bank covering both lateral ends of the first electrode and defining an emission area which corresponds to an aperture portion of the active area;
an emission layer disposed on the first electrode and in the emission area defined by the bank;
a second electrode disposed on the emission layer and a first portion of the bank; and
a conductive layer disposed on the second electrode and positioned on the first portion of the bank and extended onto a second portion of the bank where no second electrode is provided,
wherein no conductive layer is provided on the emission layer at the plurality of aperture portions, and no bank is provided at the low level voltage line contact portion, and
wherein the conductive layer is in contact with the second electrode that is disposed on the first portion of the bank, and the conductive layer is further in contact with the second connection electrode at the low level voltage line contact portion,
wherein the source-drain electrodes and the first connection electrode are disposed on a same layer and made of a same material, and
wherein the first electrode and the second connection electrode are disposed on a same layer and made of a same material.

10. The electroluminescent display device according to claim 9, wherein the conductive layer includes a reflective material.

11. The electroluminescent display device according to claim 9, wherein the planarization layer and the passivation layer have a contact hole.

12. The electroluminescent display device according to claim 11, wherein the second electrode is electrically connected with the low level voltage line through the second connection electrode located in the contact hole.

13. The electroluminescent display device according to claim 11, wherein the second electrode is electrically connected with the low level voltage line through the second connection electrode located in the contact hole.

14. The electroluminescent display device according to claim 9, wherein the second electrode is disposed at the low level voltage line contact portion.

15. The electroluminescent display device according to claim 9, wherein the second electrode is disposed at the aperture portion.

16. An electroluminescent display device comprising:
a substrate where an active area and a non-active area are defined, wherein the active area includes an aperture portion and a bank portion, and the non-active area includes a gate driver, a pad portion and a low level voltage line contact portion;
a thin film transistor disposed at the aperture portion of the active area, wherein the thin film transistor including an active layer, a gate insulating layer, a gate electrode, an intermediate insulating layer and source-drain electrodes;
a passivation layer covering the thin film transistor and having first and second contact holes;
a first electrode disposed at the aperture portion and electrically connected to the thin film transistor;
the bank portion covering both lateral ends of the first electrode and defining an emission area which corresponds to the aperture portion of the active area;
a second electrode disposed on the emission layer and a first portion of the bank portion;
an emission layer disposed between the first and second electrodes in the emission area defined by the bank portion;
a low level voltage line disposed at a low level voltage line contact portion of the non-active area;
a first connection electrode disposed at a same layer and made of a same material with the source-drain electrodes, the first connection electrode connected to the low level voltage line;
a second connection electrode disposed at a low level voltage line contact portion of the non-active area and electrically connected to the low level voltage line; and
a conductive layer disposed on the second electrode that is disposed on the first portion of the bank portion and extended onto a second portion of the bank where no second electrode is provided,
wherein no conductive layer is provided on the emission layer at the plurality of aperture portions, and no bank is provided at the low level voltage line contact portion, and
wherein the conductive layer is in contact with the second electrode that is disposed on the first portion of the bank portion, and the conductive layer is further in contact with the second connection electrode at the low level voltage line contact portion, and
wherein the first electrode and the second connection electrode are disposed on a same layer and made of a same material.

17. The electroluminescent display device according to claim 16, wherein the conductive layer includes a reflective material.

18. The electroluminescent display device according to claim 16, further comprising a planarization layer disposed between the first electrode and the passivation layer having third and fourth contact holes respectively connected to the first and second contact holes of the passivation layer.

19. The electroluminescent display device according to claim 16, wherein the second electrode is disposed at the low level voltage line contact portion.

20. The electroluminescent display device according to claim 18, wherein the second electrode is electrically connected to the low level voltage line through the second connection electrode located in the second and fourth contact holes.

* * * * *